(12) United States Patent
Kudo et al.

(10) Patent No.: US 8,629,482 B2
(45) Date of Patent: Jan. 14, 2014

(54) METHOD FOR MANUFACTURING SEMICONDUCTOR DEVICE

(75) Inventors: Tomoyasu Kudo, Oita (JP); Kenichi Yoshino, Oita (JP); Masaki Kamimura, Oita (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 3 days.

(21) Appl. No.: 13/525,616

(22) Filed: Jun. 18, 2012

(65) Prior Publication Data

US 2013/0183792 A1 Jul. 18, 2013

(30) Foreign Application Priority Data

Jan. 18, 2012 (JP) ................................. 2012-007913

(51) Int. Cl.
*H01L 27/148* (2006.01)

(52) U.S. Cl.
USPC .... 257/233; 257/225; 257/222; 257/E31.127; 438/65; 438/72; 438/75; 438/459

(58) Field of Classification Search
USPC ................... 257/40, 225, 222, 291, 432, 460, 257/E31.127, E27.13; 438/65, 72, 75, 459, 438/575, 550, 558
See application file for complete search history.

(56) References Cited

U.S. PATENT DOCUMENTS

| 2007/0210395 A1 | 9/2007 | Maruyama et al. |
| 2010/0141816 A1 | 6/2010 | Maruyama et al. |
| 2011/0058062 A1 | 3/2011 | Maruyama et al. |

FOREIGN PATENT DOCUMENTS

| JP | 2007-258684 | 10/2007 |
| JP | 2010-219439 | 9/2010 |
| JP | 2010-239005 | 10/2010 |

*Primary Examiner* — Mark A Laurenzi
(74) *Attorney, Agent, or Firm* — Oblon, Spivak, McClelland, Maier & Neustadt, L.L.P.

(57) ABSTRACT

According to one embodiment, a method for manufacturing a semiconductor device includes implanting impurity ions to a semiconductor layer in which an electrode is embedded; forming a light absorption film which absorbs laser light at a side of the electrode to which the laser light is irradiated; and activating the impurity ions by irradiating laser light to the semiconductor layer at which the light absorption film is formed in the forming.

13 Claims, 5 Drawing Sheets

METHOD FOR MANUFACTURING SEMICONDUCTOR DEVICE

CROSS-REFERENCE TO RELATED APPLICATIONS

This application is based upon and claims the benefit of priority from Japanese Patent Application No. 2012-007913, filed on Jan. 18, 2012; the entire contents of which are incorporated herein by reference.

FIELD

Embodiments described herein relate generally to a method for manufacturing a semiconductor device.

BACKGROUND

In a process for manufacturing a semiconductor device, a method has been employed to form a diffusion area of impurity ions at a surface of a semiconductor layer as activating the impurity ions by performing annealing treatment as irradiating laser light to the semiconductor layer after the impurity ions are implanted to the semiconductor layer in which an electrode is embedded.

In such a manufacturing process, when the annealing treatment is performed as irradiating laser light to the entire surface of the semiconductor layer, for example, there may be a case that a yield rate is decreased with elution of the electrode from the semiconductor layer due to heat generated at the time of the annealing treatment.

On the other hand, when the annealing treatment is performed as irradiating laser light selectively to positions where the impurity ions are implanted, laser annealing is required to be performed sequentially to many positions in a case that impurity ions are implanted to the many positions at the semiconductor layer. Accordingly, throughput is decreased.

DETAILED DESCRIPTION

In general, according to one embodiment, a method for manufacturing a semiconductor device includes implanting impurity ions to a semiconductor layer in which an electrode is embedded; forming a light absorption film which absorbs laser light at a side of the electrode to which the laser light is irradiated; and activating the impurity ions by irradiating laser light to the semiconductor layer at which the light absorption film is formed in the forming.

Exemplary embodiments of a method for manufacturing a semiconductor device will be explained below in detail with reference to the accompanying drawings. Here, the present invention is not limited to the following embodiments. Further, although a method for manufacturing a backside illumination type complementary metal oxide semiconductor (CMOS) image sensor will be explained in the following, the semiconductor device to be manufactured with the manufacturing method according to the embodiment is not limited to a backside illumination type CMOS image sensor.

Figure 1:
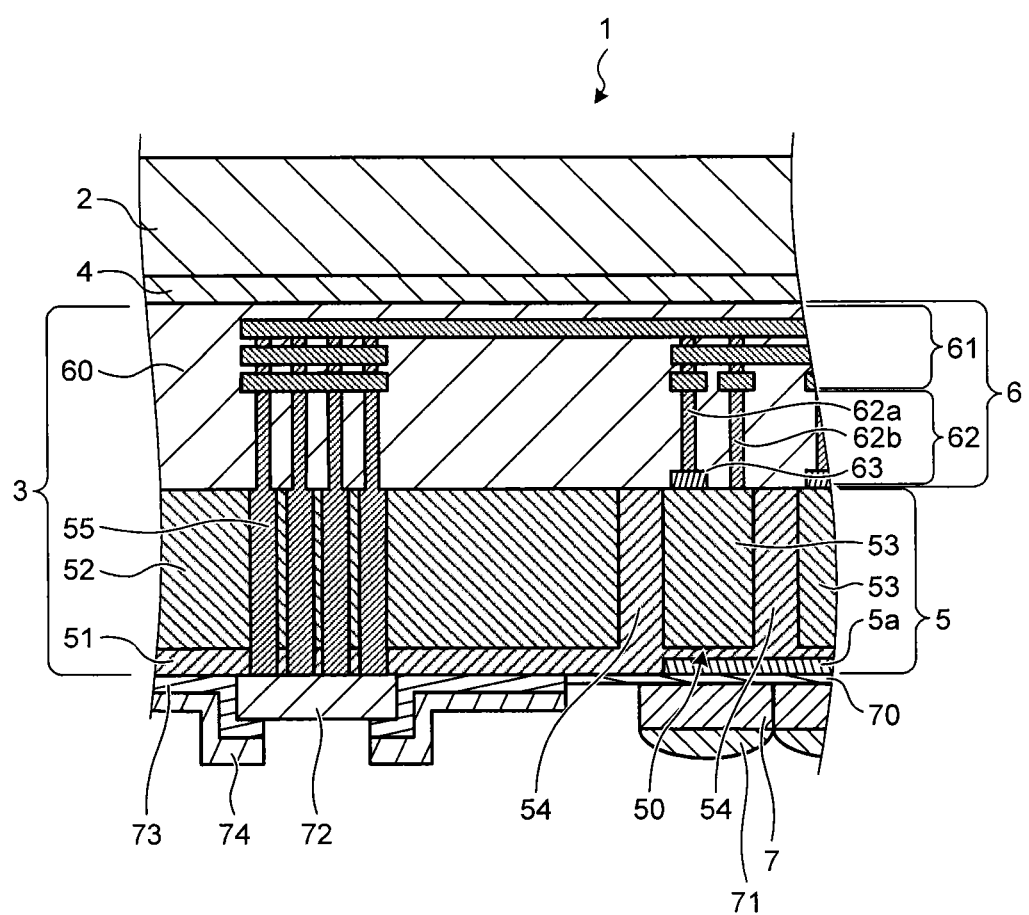
FIG. 1 is a schematic view illustrating a section of an image sensor manufactured with a manufacturing method according to an embodiment.

First, a structure and operation of a backside illumination type CMOS image sensor (hereinafter, described as the image sensor 1) which is manufactured with the manufacturing method according to the embodiment will be explained. FIG. 1 is a schematic view illustrating a section of the image sensor 1 manufactured with the manufacturing method according the embodiment. In the following, explanation is performed as defining a side of a support substrate 2 in FIG. 1 as the upper or the front for convenience.

As illustrated in FIG. 1, the image sensor 1 includes the support substrate 2 and a device substrate 3 which is stuck to a back face (lower face) of the support substrate 2 via a sticking layer 4. Further, the device substrate 3 includes an element formative layer 5 and a multi-layer wiring layer 6.

The element formative layer 5 includes a silicon epitaxial layer to which first conductive type (P-type) impurity is doped (hereinafter, described as a "first epilayer 51") and a silicon epitaxial layer to which second conductive type (N-type) impurity is doped (hereinafter, described as a "second epilayer 52").

In the image sensor 1, a plurality of photodiodes 50 formed with PN junction of the first epilayer 51 and the second epilayer 52 at predetermined positions of the device substrate 3 functions as photoelectric conversion elements.

Each photoelectric conversion element includes a charge accumulation area 53 which accumulates charges photoelectrically converted by the photodiode 50. The charge accumulation areas 53 being structured with the second epilayer 52 are plurally arranged in a matrix manner at a light-receiving area.

Further, the image sensor 1 includes an impurity diffusion area (hereinafter, described as the P+ area 5a) having higher density of P-type impurity than the first epilayer 51 at the inside of a predetermined position at the back side (lower side in FIG. 1) of the first epilayer 51 to be the light-receiving area of the photodiode 50.

Thus, since the image sensor 1 includes the P+ area 5a at the light-receiving area of the photodiode 50, it is possible to suppress that charges accumulated at the charge accumulation area 53 in a state without having incident light to the photodiode 50 flows to the multi-layer wiring layer 6 side as dark current.

Accordingly, it is possible to prevent that a taken image becomes to a whitish image compared to an actual imaging target when imaging is performed in a relatively dark place. Details of procedure for forming the P+ area 5a will be described later with reference to FIGS. 2 to 7.

Further, as illustrated in FIG. 1, the respective charge accumulation areas 53 are electrically separated by an element separation area 54 which is structured with the first epilayer 51. For example, the element separation area 54 is formed by forming a recess at an area for forming the element separation area 54 in the second epilayer 52 and epitaxially growing a semiconductor layer to which P-type impurity is doped in the recess.

Alternatively, the element separation area 54 is formed by performing pattern etching on the first epilayer 51 so as to have a shape of the element separation area 54. In this case, the second epilayer 52 is formed by epitaxially growing a semiconductor layer to which N-type impurity is doped at the area where the first epilayer 51 is eliminated with the pattern etching.

Further, a corresponding three primary color filter 7 is arranged at the back face of each photodiode 50 via a reflection prevention film 70, and then, a micro lens 71 is arranged at the back face of each color filter 7. That is, one pixel is structured at the image sensor 1 with three adjacent photodiodes 50 respectively having the three primary color filter 7.

Further, a reading transistor, an amplifying transistor, resetting transistor and the like are arranged at a joint portion of the element formation layer 5 and the multi-layer wiring layer 6 in accordance with each photoelectric conversion element. In FIG. 1, illustration of structural components of the above transistors other than a gate 63 of the reading transistor is skipped.

Here, the reading transistor is a transistor to be in an ON-state when reading charges from the charge accumulation area 53. The amplifying transistor is a transistor to amplify the charges read from the charge accumulation area 53. The resetting transistor is a transistor to discharge the charges accumulated at the charge accumulation area 53.

Further, a through via 55 which connects the multi-layer wiring layer and an electrode pad 72 arranged at a predetermined position of the back face is arranged at the element formation layer 5. Here, the electrode pad 72 is protected while a circumferential part of a bottom face and a side face are covered by a passivation nitride film 73 and a passivation oxide film 74.

Further, the multi-layer wiring layer 6 includes a metal wiring layer 61 which is arranged inside an interlayer insulation film 60 and a through via layer 62. Metal wiring is arranged at the metal wiring layer 61 in a multi-step manner. Further, a plurality of through vias 62a, 62b is arranged at the through via layer 62.

Then, the electrode pad 72 is connected to the abovementioned reading transistor, amplifying transistor, resetting transistor and the like by the through via 55 of the element formative layer 5, the through via 62a, 62b and the metal wiring layer 61 of the multi-layer wiring layer 6.

The image sensor 1 performs imaging with following operation. First, in the image sensor 1, incident light from the micro lens 71 arranged at the back face is converted into charges corresponding to light strength by each photodiode 50 and accumulated at the charge accumulation area 53.

Subsequently, the image sensor 1 performs imaging as reading charges from the charge accumulation area 53 by driving the reading transistor and the like based on a predetermined control signal input from a control unit (not illustrated) to the electrode pad 72.

Next, processes for manufacturing the image sensor 1 with the manufacturing method according to the embodiment will be explained with reference to FIGS. 2 to 7. FIGS. 2 to 7 are schematic sectional views illustrating an example of the processes for manufacturing the image sensor 1 with the manufacturing method according to the embodiment. Here, in FIGS. 2 to 7, the same numeral is given to the same structural element as that illustrated in FIG. 1.

Figure 2:
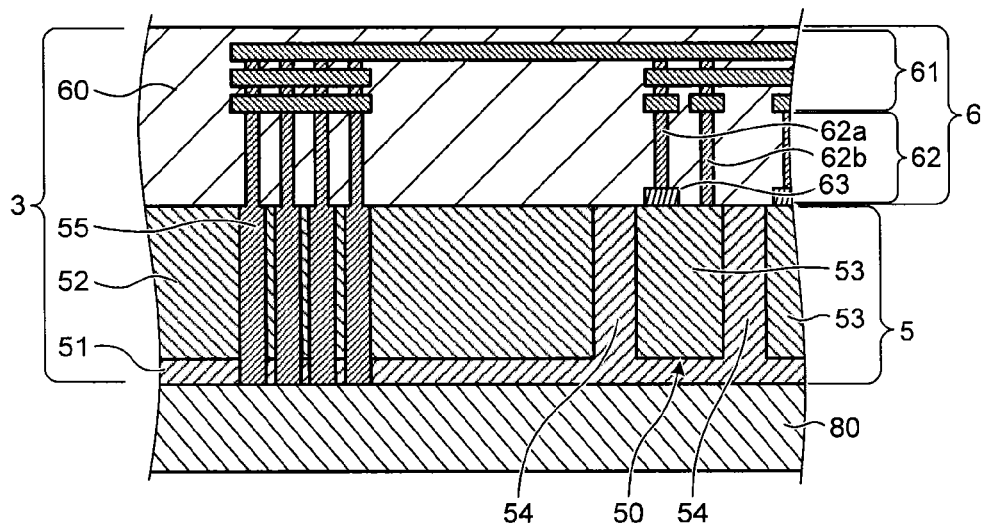
FIGS. 2 to 7 are schematic sectional views illustrating an example of a process for manufacturing an image sensor with the manufacturing method according to the embodiment.

In the manufacturing method according to the embodiment, as illustrated in FIG. 2, a layer to be the device substrate 3 is formed on a semiconductor substrate 80 such as a silicon wafer, for example. Here, an example of a method for forming the layer to be the device substrate 3 is briefly explained.

First, the first epilayer 51 is processed into a shape as illustrated in FIG. 1 by performing photolithographing and etching after the first epilayer 51 is formed on the upper face of the semiconductor substrate 80. Then, the second epilayer 52 is formed at the area where the first epilayer 51 is eliminated in the etching process.

Subsequently, a contact hole penetrating the first epilayer 51 and the second epilayer 52 is formed by performing etching at predetermined positions of the first epilayer 51 and the second epilayer 52. Then, the through via 55 is formed by embedding a metal into the contact hole.

Subsequently, the multi-layer wiring layer 6 is formed by sequentially repeating a process to form an insulation film on the second epilayer 52, a process to perform patterning on the insulation film, and a process to form an electrode of which material is polysilicon or the like or an electrode of which material is metal, for example, at a predetermined position of the insulation film on which patterning is performed.

Figure 3:
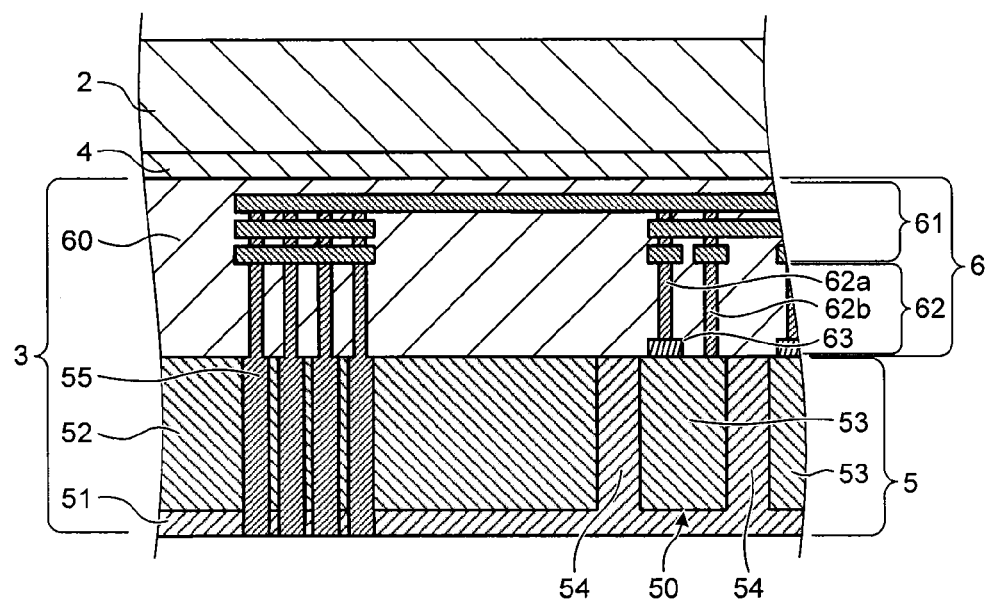

Next, as illustrated in FIG. 3, the support substrate 2 is stuck to the upper face of the multi-layer wiring layer 6 via the sticking layer 4 and the lower face of the first epilayer 51 is exposed by grinding the lower face of the semiconductor substrate 80 in a state of supporting the support substrate 2.

Figure 4:
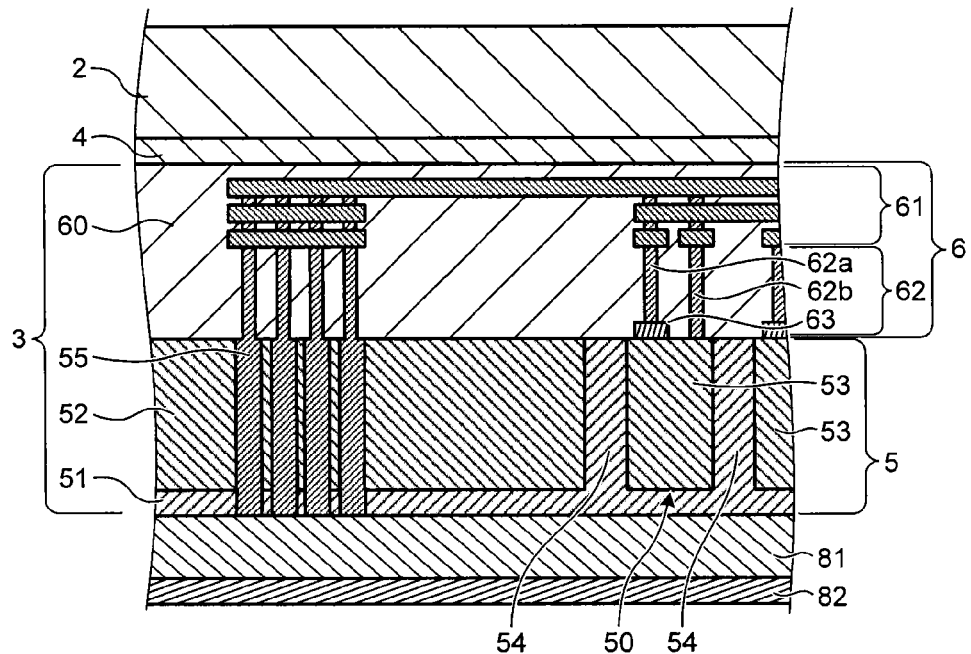

Next, as illustrated in FIG. 4, a heat diffusion suppression film 81 is formed to cover the lower face of the first epilayer 51 and the lower face (bottom face) of the through via 55. The heat diffusion suppression film 81 is an insulation film having a predetermined thickness of which material is tetraethoxysilane (TEOS) or the like, for example.

Here, the heat diffusion suppression film 81 is formed to have a thickness at least being 450 nm or more as being the thickness to be capable of suppressing heat generated in a later-performed annealing process from being diffused to the first epilayer 51 and the through via 55.

Subsequently, a light absorption film 82 which absorbs laser light which is used in the annealing process is formed at the lower face of the heat diffusion suppression film 81. The light absorption film 82 is formed of material which has a light-absorbing property such as amorphous silicon, for example.

The amorphous silicon light absorption film 82 can be formed at lower temperature than copper (Cu) melting temperature (about 400° C.) in a case that the through via 55 is formed of Cu, for example. Accordingly, it is possible to prevent elution of the through via 55 due to film-forming of the light absorption film 82. Here, the light absorption film 82 is formed to have a thickness being 10 nm or more, and preferably, being 60 nm or more so that optical absorptance becomes 70% or higher.

Figure 5:
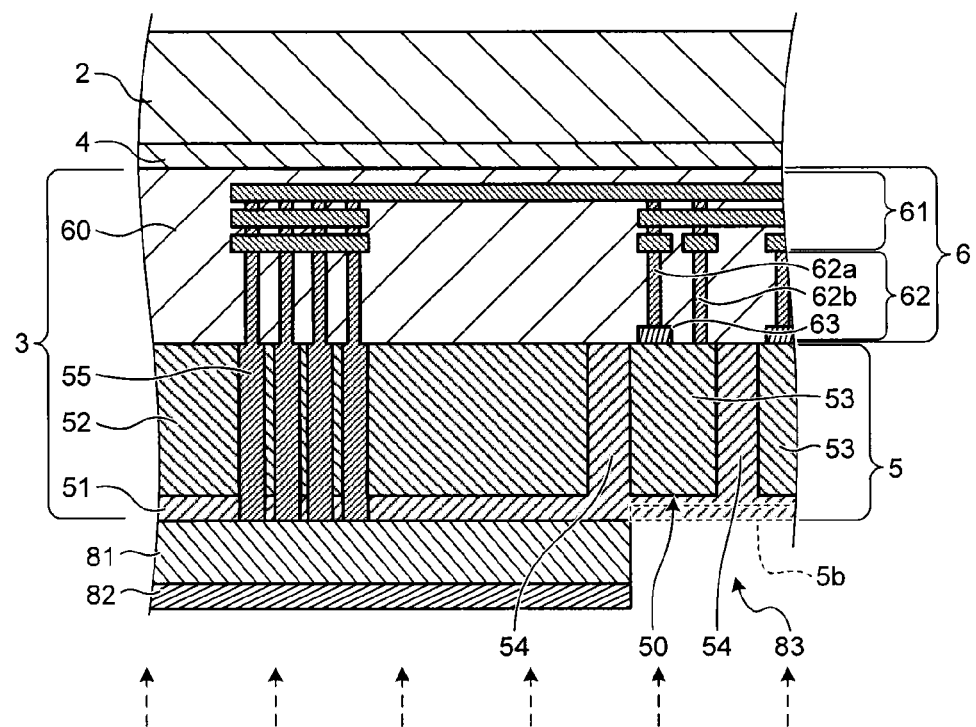

Next, as illustrated in FIG. 5, an opening portion 83 is formed by selectively eliminating the light absorption film 82 and the heat diffusion suppression film 81 formed at the lower face of a predetermined position of the first epilayer 51 which is to be the light-receiving area of the photodiode 50. The opening portion 83 is formed with photolithographing and etching, for example. Thus, the surface at the lower face of the first epilayer 51 to be the formative area of the P+ area 5a (see FIG. 1) is selectively exposed at the predetermined position.

Subsequently, as illustrated by broken line arrows in FIG. 5, P-type impurity ions are bombarded toward the lower face of the light absorption film 82 and the selectively-exposed lower side surface of the first epilayer 51 having the light absorption film 82 and the heat diffusion suppression film 81 as masks.

Thus, an ion implantation area 5b is formed as P-type impurity ions being implanted to the inside of the first epilayer 51 from the selectively-exposed lower side surface of the first epilayer 51. At that time, since the light absorption film 82 and the heat diffusion suppression film 81 function as the masks, areas of the lower face of the first epilayer 51 other than the area to be the light-receiving area of the photodiode 50 is prevented from being damaged by the collision with the impurity ions.

Here, the light absorption film 82 and the heat diffusion suppression film 81 are used as the masks. However, it is also possible to perform implantation of impurity ions as forming a dedicated mask for ion implantation. In this case, as illustrated in FIG. 3, an insulation film is formed at the lower face of the first epilayer 51 and the through via 55 exposed as grinding the semiconductor substrate 80 (see FIG. 2), for example.

Figure 6:
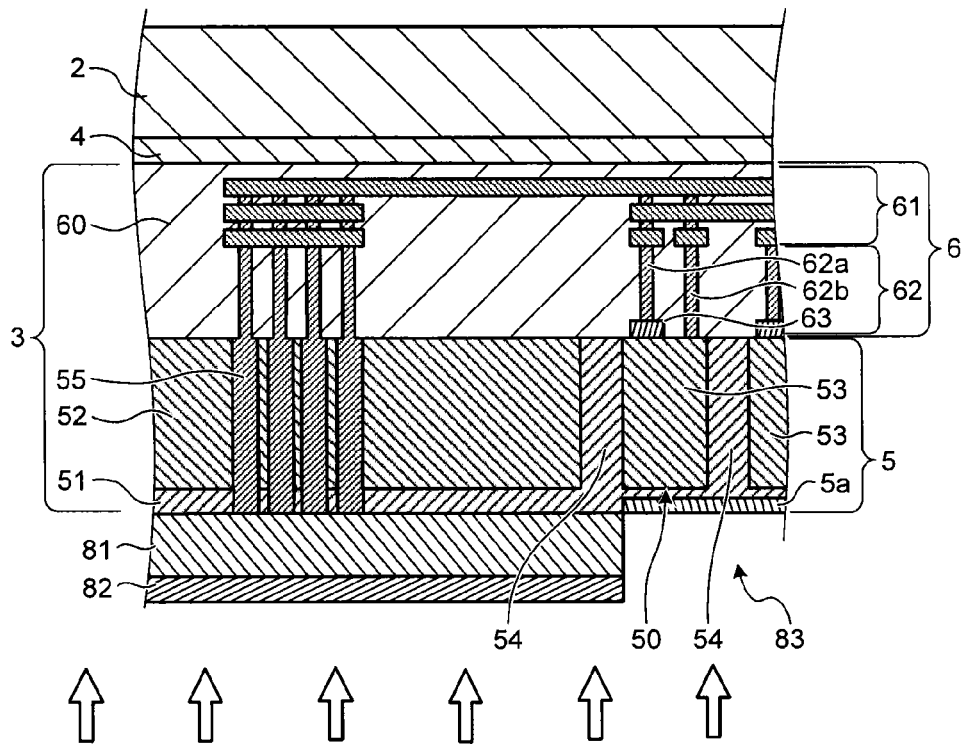

Subsequently, the mask is formed by selectively eliminating the insulation film at a part where the light-receiving area of the photodiode 50 is covered. Then, the ion implantation area 5b is formed by performing implantation of impurity ions using the above mask. Subsequently, the heat diffusion suppression film 81 and the light absorption film 82 illustrated in FIG. 6 are formed after removing the mask. With the above, it is possible to prevent the light absorption film 82 from being damaged by the implantation of impurity ions.

Further, it is also possible to use the heat diffusion suppression film 81 as the mask for implantation of impurity ions. In such a case, after the heat diffusion suppression film 81 is formed, the heat diffusion suppression film 81 at a part where the light-receiving area of the photodiode 50 is covered is selectively eliminated.

Then, the ion implantation area 5b is formed as performing implantation of impurity ions having the heat diffusion suppression film 81 as the mask. Subsequently, the light absorption film 82 illustrated in FIG. 5 is formed at the lower face of the heat diffusion suppression film 81. Accordingly, since it is not required to form a dedicated mask for implantation of impurity ions, cost for manufacturing can be reduced.

Next, as illustrated by outline arrows in FIG. 6, the annealing treatment is performed as irradiating laser light such as excimer laser toward the lower face of the light absorption film 82 and the selectively-exposed lower side surface (ion implantation area 5b) of the first epilayer 51 as having the light absorption film 82 and the heat diffusion suppression film 81 as the masks. Accordingly, the impurity ions at the inside of the ion implantation area 5b (see FIG. 5) are activated as being heated and the P+ area 5a is formed.

At that time, the light absorption film 82 is formed at the side of the first epilayer 51 and the through via 55 to which the laser light is irradiated. When laser light is irradiated, the light absorption film 82 absorbs most part of the laser light. Accordingly, with the manufacturing method according to the embodiment, it is possible to suppress the first epilayer 51 excepting an area where the P+ area 5a is to be formed and the through via 55 from being heated by heat generated by irradiation of laser light at the time of annealing treatment.

Further, the heat diffusion suppression film 81 is formed between the light absorption film 82 and the first epilayer 51 excepting the area where the P+ area 5a is to be formed as well as the lower face of the through via 55. The heat diffusion suppression film 81 suppresses heat transfer from the light absorption film 82 to the first epilayer 51 excepting the area where the P+ area 5a is to be formed and the through via 55.

Accordingly, with the manufacturing method according to the embodiment, it is possible to suppress the first epilayer 51 excepting the area where the P+ area 5a is to be formed and the through via 55 from being heated by heat generated by irradiation of laser light at the time of the annealing treatment.

Figure 7:
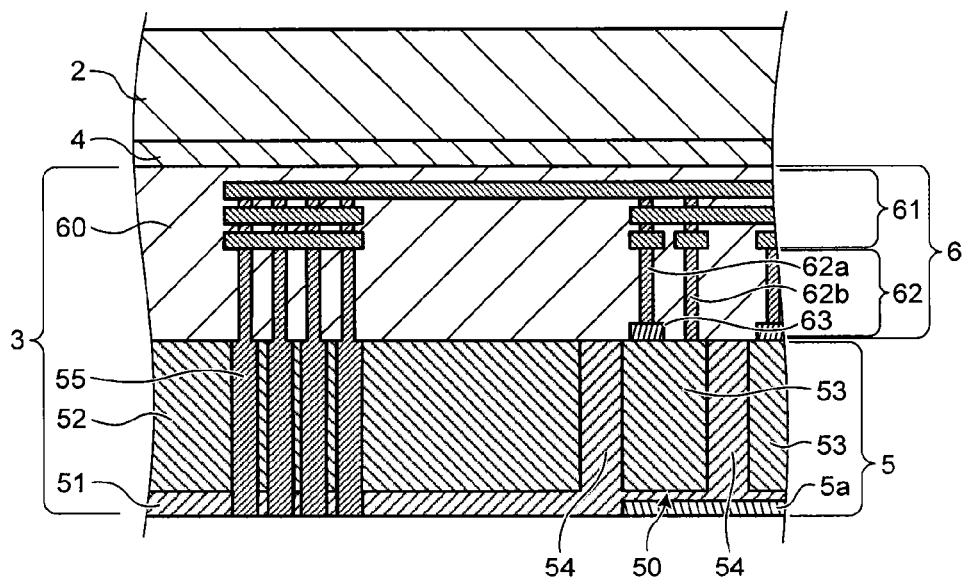

Next, as illustrated in FIG. 7, the light absorption film 82 and the heat diffusion suppression film 81 are eliminated from the lower face of the first epilayer 51. Subsequently, the image sensor 1 (see FIG. 1) is manufactured by sequentially forming the reflection prevention film 70, the electrode pad 72, the color filter 7, the micro lens 71, the passivation nitride film 73, the passivation oxide film 74 and the like illustrated in FIG. 1 at the lower face of the first epilayer 51.

Thus, in the manufacturing method according to the embodiment, the light absorption film 82 which absorbs laser light is formed at the side of the through via 55 embedded in the first epilayer 51 to which the laser light is irradiated before the annealing treatment using laser light is performed.

Accordingly, with the manufacturing method according to the embodiment, since elution of the through via 55 as being heated by heat generated as the time of the annealing treatment can be prevented, a yield rate can be improved.

Further, in the manufacturing method according to the embodiment, the heat diffusion suppression film 81 which suppresses diffusion of heat generated with the annealing treatment to the through via 55 side is formed at the lower side surface of the first epilayer 51 and the through via 55 at the side of the through via 55 embedded in the first epilayer 51 to which laser light is irradiated. Then, the light absorption film 82 is formed at the lower side surface of the heat diffusion suppression film 81.

Accordingly, with the manufacturing method according to the embodiment, since elution of the through via 55 as being heated by heat generated as the time of the annealing treatment can be prevented, a yield rate can be improved.

Further, in the manufacturing method according to the embodiment, the opening portion 83 through which the surface at the implantation position of impurity ions at the first epilayer 51 is exposed is formed at the light absorption film 82 and the heat diffusion suppression film 81. Then, in the manufacturing method according to the embodiment, impurity ions are implanted having the light absorption film 82 and the heat diffusion suppression film 81 to which the opening portion 83 is formed as the masks.

Accordingly, with the manufacturing method according to the embodiment, the first epilayer 51 and the through via 55 which are covered by the light absorption film 82 and the heat diffusion suppression film 81 can be prevented from being damaged by implantation of impurity ions.

Further, with the manufacturing method according to the embodiment, the P+ area 5a can be formed by irradiating laser light at once from the lower side toward the entire device substrate 3 to which the heat diffusion suppression film 81 and the light absorption film 82 at the lower face. Accordingly, with the manufacturing method according to the embodiment, since a plurality of the P+ areas 5a can be concurrently formed with one time of irradiation of laser light, throughput can be improved.

Further, in the manufacturing method of the embodiment, an amorphous silicon film having high light-absorbing property is formed as the light absorption film 82. Accordingly, with the manufacturing method according to the embodiment, the light absorption film 82 can be formed thinner compared to a case that the light absorption film is formed of material having lower light-absorbing property than amorphous silicon.

Accordingly, with the manufacturing method of the embodiment, since film forming and eliminating of the light absorption film 82 can be performed in a shorter time compared to a case that the light absorption film is formed of material having lower light-absorbing property than amorphous silicon, throughput can be improved.

Further, in the manufacturing method according to the embodiment, the annealing treatment is performed as implanting impurity ions to a predetermined position of the first epilayer 51 to be the light-receiving area of the image sensor 1. Accordingly, with the manufacturing method according to the embodiment, it is possible to manufacture the image sensor 1 including the P+ area 5a which suppresses that charges accumulated at the charge accumulation area 53 in a state without having incident light to the photodiode 50 flows to the multi-layer wiring layer 6 side as dark current.

Here, in the abovementioned embodiment, implantation of impurity ions and irradiation of laser light are performed after forming the heat diffusion suppression film 81 and the light absorption film 82 and performing patterning into a predetermined shape. However, it is also possible to perform implantation of impurity ions before forming the heat diffusion suppression film 81 and the light absorption film 82.

Figure 8:
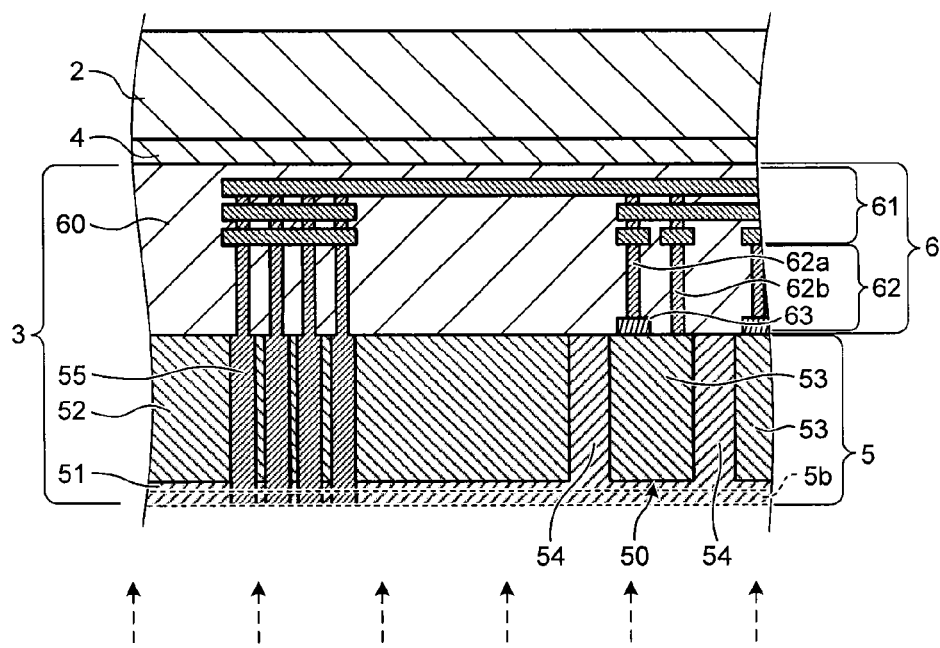
FIGS. 8 and 9 are schematic sectional views illustrating an example of manufacturing processes according to the embodiment in which implantation of impurity ions is performed before forming a heat diffusion suppression film and a light absorption film.
Figure 9:
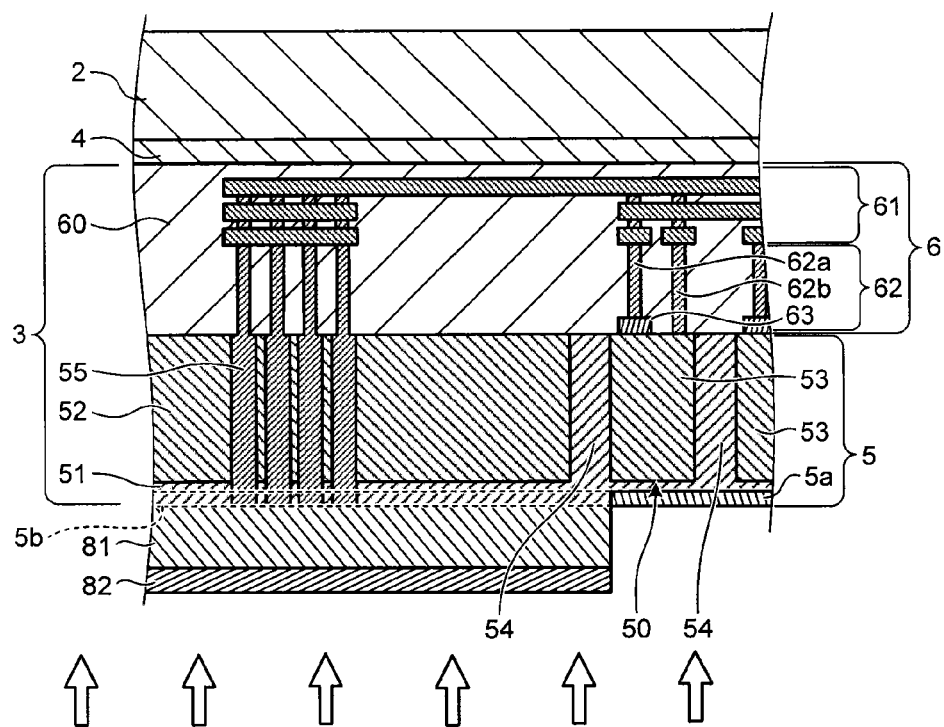

In the following, a manufacturing process to perform implantation of impurity ions before forming the heat diffusion suppression film 81 and the light absorption film 82 will be explained with reference to FIGS. 8 and 9. FIGS. 8 and 9 are schematic sectional views illustrating an example of the manufacturing processes according to the present embodiment to perform implantation of impurity ions before forming the heat diffusion suppression film 81 and the light absorption film 82.

In a case that implantation of impurity ions is performed before forming the heat diffusion suppression film 81 and the light absorption film 82, P-type impurity ions are implanted to the first epilayer 51 which is exposed as the semiconductor substrate 80 being ground and the entire lower face of the through via 55 (see FIG. 3), as illustrated by broken line arrows in FIG. 8.

With the above, P-type impurity ions are implanted to the inside of the first epilayer 51 and the through via 55 from the exposed first epilayer 51 and the entire lower face of the through via 55, so that the ion implantation area 5b is formed. Subsequently, the heat diffusion suppression film 81 and the light absorption film 82 are sequentially formed at the exposed first epilayer 51 and the entire lower face of the through via 55 (see FIG. 4).

Next, as illustrated in FIG. 9, the opening portion 83 (see FIG. 5) is formed by selectively eliminating the light absorption film 82 and the heat diffusion suppression film 81 which are formed at a predetermined position of the lower face of the first epilayer 51 to be the light-receiving area of the photodiode 50.

Subsequently, as illustrated by outline arrows in FIG. 9, the annealing treatment is performed as irradiating laser light toward the lower face of the light absorption film 82 and the selectively-exposed lower side surface of the first epilayer 51 as having the light absorption film 82 and the heat diffusion suppression film 81 as the masks. Accordingly, the impurity ions at the inside of the ion implantation area 5b are activated as being heated and the P+ area 5a is formed.

In this manner, even when implantation of impurity ions is performed before forming the heat diffusion suppression film 81 and the light absorption film 82, elution of the through via 55 due to heat generated at the time of the annealing treatment can be prevented by forming the heat diffusion suppression film 81 and the light absorption film 82 before performing the annealing treatment.

Further, in a case that implantation of impurity ions is performed before forming the heat diffusion suppression film 81 and the light absorption film 82, the ion implantation area 5b is formed at the vicinity of the lower side surface of the first epilayer 51 and the through via 55.

However, with the manufacturing method according to the embodiment, since the heat diffusion suppression film 81 and the light absorption film 82 which cover the side of the through via 55 to which laser light is irradiated are formed before the annealing treatment, impurity ions in the ion implantation area 5b are not activated by the annealing treatment.

Accordingly, with the manufacturing method according to the embodiment, since it can be prevented that a diffusion area of impurity ions is formed at the vicinity of the through via 55, it can be prevented that leakage current flows between the through vias 55.

Here, instead of the light absorption film 82 in the abovementioned embodiment, it is also possible to form a light reflection film having a property to reflect laser light. Thus, it is possible to prevent laser light from being irradiated to the lower side surface of the through via 55 at the time of the annealing treatment also by forming the light reflection film instead of the light absorption film 82. Accordingly, a yield rate can be improved as preventing elution of the through via 55 due to heat generated at the time of the annealing treatment.

Further, in the abovementioned embodiment, explanation is performed on a case that the heat diffusion suppression film 81 and the light absorption film 82 are formed in one layer each. However, it is also possible to form a plurality of layers for both or either of the heat diffusion suppression film 81 and the light absorption film 82.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for manufacturing a semiconductor device, comprising:
   implanting impurity ions to a semiconductor layer in which an electrode is embedded;
   forming a light absorption film which absorbs laser light at a side of the electrode to which the laser light is irradiated; and
   activating the impurity ions by irradiating laser light to the semiconductor layer at which the light absorption film is formed in the forming.

2. The method for manufacturing a semiconductor device according to claim 1, further comprising forming a heat diffusion suppression film at a surface of the semiconductor layer to suppress diffusion of heat generated in the activating to the electrode side,
   wherein the light absorption film is formed on a surface of the heat diffusion suppression film in the forming the light absorption film.

3. The method for manufacturing a semiconductor device according to claim 2, further comprising forming an opening portion through which a surface of an implantation position of the impurity ions at the semiconductor layer is exposed is formed at the light absorption film and the heat diffusion suppression film.

4. The method for manufacturing a semiconductor device according to claim 1,
   wherein an amorphous silicon film is formed as the light absorption film in the forming the light absorption film.

5. The method for manufacturing a semiconductor device according to claim 1, wherein the impurity ions are implanted to the semiconductor layer which is to be a light-receiving area of a solid-state imaging element in the implanting.

6. The method for manufacturing a semiconductor device according to claim 1,
wherein the light absorption film of which optical absorptance of the laser light is 70% or higher is formed in the forming the light absorption film.

7. The method for manufacturing a semiconductor device according to claim 1,
wherein the light absorption film of which thickness is 10 nm or more is formed in the forming the light absorption film.

8. The method for manufacturing a semiconductor device according to claim 3,
wherein the impurity ions are implanted to the semiconductor layer having the light absorption film and the heat diffusion suppression film at which the opening portion is formed as masks in the implanting.

9. The method for manufacturing a semiconductor device according to claim 3,
wherein the laser light is irradiated to the entire side of the semiconductor layer to which the laser light is irradiated having the light absorption film and the heat diffusion suppression film at which the opening portion is formed as masks in the activating.

10. The method for manufacturing a semiconductor device according to claim 2, further comprising forming an insulation film which covers a surface of the semiconductor layer other than the implantation position of the impurity ions,
wherein the impurity ions are implanted to the semiconductor layer having the insulation film as a mask in the implanting; and
the heat diffusion suppression film is formed at a surface of the semiconductor layer from which the insulation film is eliminated after the ion implantation step in the forming the heat diffusion suppression film.

11. The method for manufacturing a semiconductor device according to claim 2, further comprising forming an opening portion through which a surface of an implantation position of the impurity ions at the semiconductor layer is exposed is formed at the heat diffusion suppression film,
wherein the impurity ions are implanted to the semiconductor layer having the heat diffusion suppression film as a mask in the implanting.

12. The method for manufacturing a semiconductor device according to claim 2,
wherein the heat diffusion suppression film is formed on a surface of the semiconductor layer to which the impurity ions are implanted in the implanting, in the forming the heat diffusion suppression film.

13. A method for manufacturing a semiconductor device, comprising:
implanting impurity ions to a semiconductor layer in which an electrode is embedded;
forming a light reflection film which reflects laser light at a side of the electrode to which the laser light is irradiated; and
activating the impurity ions by irradiating laser light to the semiconductor layer at which the light reflection film is formed in the forming the light reflection film.

* * * * *